(12) United States Patent
Akamatsu

(10) Patent No.: US 6,215,682 B1
(45) Date of Patent: Apr. 10, 2001

(54) SEMICONDUCTOR POWER CONVERTER AND ITS APPLIED APPARATUS

(75) Inventor: Masahiko Akamatsu, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/529,030

(22) PCT Filed: Sep. 18, 1998

(86) PCT No.: PCT/JP98/04225

§ 371 Date: Apr. 6, 2000

§ 102(e) Date: Apr. 6, 2000

(87) PCT Pub. No.: WO00/17927

PCT Pub. Date: Mar. 30, 2000

(51) Int. Cl.[7] .................................................. H05K 7/20
(52) U.S. Cl. ................................................ 363/141; 361/699
(58) Field of Search ............................. 363/141; 361/699

(56) References Cited

U.S. PATENT DOCUMENTS

| | | | |
|---|---|---|---|
| 5,123,478 | * | 6/1992 | Hosaka ................................. 165/292 |
| 5,333,676 | * | 8/1994 | Mizuno ................................. 165/294 |
| 5,491,610 | | 2/1996 | Mok et al. ............................. 361/695 |
| 5,535,818 | * | 7/1996 | Fujisaki et al. ................... 165/104.33 |
| 5,606,239 | * | 2/1997 | Schumann ................................. 320/3 |

FOREIGN PATENT DOCUMENTS

| | | |
|---|---|---|
| 58-186956 | 11/1983 | (JP) . |
| 63-192254 | 8/1988 | (JP) . |
| 649817 | 2/1989 | (JP) . |
| 2120690 | 5/1990 | (JP) . |
| 2208479 | 8/1990 | (JP) . |
| 4130698 | 5/1992 | (JP) . |
| 5168238 | 7/1993 | (JP) . |
| 6233544 | 8/1994 | (JP) . |

* cited by examiner

Primary Examiner—Adolf Deneke Berhang
(74) Attorney, Agent, or Firm—Leydig, Voit & Mayer, Ltd.

(57) ABSTRACT

In order to keep constant an outlet temperature of a refrigerant for cooling a semiconductor power device, continuous and variable control of flow rate of the refrigerant is performed. At the same time, a variable speed fan is continuously and variably controlled in response to a temperature control so that an inlet temperature of the refrigerant is kept constant.

8 Claims, 15 Drawing Sheets

SEMICONDUCTOR POWER CONVERTER AND ITS APPLIED APPARATUS

TECHNICAL FIELD

The present invention relates to improvement of a semiconductor power converter employing a power semiconductor device, and its applied apparatus.

BACKGROUND ART

Semiconductor power converters employing power semiconductor devices have been widely used so far. Since heat release of the power semiconductor device may cause malfunction or fracture of the semiconductor power converter, the semiconductor power converter is used by cooling the power semiconductor device. In order to cool the power semiconductor device, a forced cooling method is usually adopted in which one of gaseous and liquid cooling fluids such as air, water, fluorocarbon and insulating oil is caused to flow according to scale of the semiconductor power converter and magnitude of heat release value.

This cooling method has been adopted to such an extent that cooling fluid is caused to flow at a predetermined constant quantity or rate determined for a maximum heat release value of the semiconductor device by capability of a fan, a pump, a cooler or the like in order to simplify structure and upgrade economy of the semiconductor power converter as much as possible or that even if control is performed, on-off control of cooling power at the utmost is performed for the purpose of saving the cooling power.

For example, an arrangement of a cooling apparatus of a semiconductor power converter disclosed in Japanese Patent Laid-Open Publication No. 4-130698 (1992) is shown in FIG. 13. In order to explain operational characteristics of the cooling apparatus, FIG. 14 shows temperature changes of a semiconductor device. In FIG. 13, a multiplier 201 multiplies a detected current of the semiconductor power converter (not shown) by an intrinsic constant of the semiconductor power converter so as to obtain a value corresponding to heat release of the semiconductor device. An integrator 202 integrates with respect to time a value obtained by subtracting the value corresponding to heat release of the semiconductor device from the multiplier 201, from a set heat dissipation constant of a setter 203 so as to obtain a value corresponding to a temperature of the semiconductor device. A comparator 204 compares a set temperature of a setter 205 and an output of the integrator 202 with each other so as to obtain a control output for effecting changeover between operation and stop of a cooling fan (not shown).

FIG. 14 shows that the semiconductor power converter is turned on and off alternately several times before temperature of the semiconductor device reaches a set value and the cooling fan is operated for the first time at a time t0. Namely, useless cooling power during this period is saved. In short, since the cooling fan is operated only when there is a risk that the semiconductor device may be fractured thermally, useless operation of the cooling fan is lessened.

However, in the above described cooling method in which cooling capability is kept constant or is subjected to on-off control, it is inevitable that temperature of the semiconductor device fluctuates due to variations of output of the semiconductor device as shown in FIG. 14 or although not specifically shown in FIG. 14, temperature variations of the semiconductor device (referred to also as a "heat cycle", hereinafter) occur in response to turning on and off of the cooling fan. In some cases, the heat cycle adversely affects the semiconductor device more than operating temperature so as to deteriorate the semiconductor device and reduce service life of the semiconductor device, thereby resulting in rise of its failure rate.

Especially, in case a load is a variable speed motor in application of the power converter, such a problem arises that since acceleration and deceleration of the variable speed motor, i.e., increase and reduction of current to the semiconductor device are repeated frequently, so that a severe heat cycle is applied to the semiconductor device even in a constant state of the cooling fan and thus, temperature of the semiconductor device fluctuates frequently, thereby resulting in drop of reliability of the power converter.

The conventional cooling method in which cooling capability is kept constant or is subjected to on-off control has the disadvantage that temperature of the semiconductor device undergoes the heat cycle as described above but has another drawback as follows. In most cases, capability for cooling the semiconductor device is set at a constant value in accordance with a maximum output of the semiconductor power converter. The maximum output referred to above represents one yielded for a period of not less than dozens of seconds (referred to as a "rated output") and heat release due to overcurrent flowing for a duration shorter than the above period is not cooled. This is because if cooling capability controlled to be constant is raised in accordance with the short-time overload rating, cooling capability to be seldom used should be secured at all times, which is quite wasteful.

As a result, for short-time overcurrent, rise of temperature of the semiconductor device is determined by thermal capacity of the semiconductor device itself and thermal capacity of a heat sink (referred to also as a "heat dissipation fin" or a "heat exchanger") to which the semiconductor device is attached.

However, for the purpose of raising reliability of the system, there is always a demand for setting short-time overcurrent capability of the power converter to as high a level as possible. On the other hand, the short-time thermal capacity of the heat sink is restricted by heat transfer rate of material of the heat sink. Therefore, such a problem is posed that a limit is reached in raising the short-time overcurrent capability of the power converter in comparison with the continuous rating.

As one example in which the above mentioned problem affects a concrete configuration of the system, a case of an applied apparatus in which a semiconductor power converter is applied to a DC power transmission system is described. In case a DC power transmission system, for example, is used by connecting a plurality of converters to the system and a fault happens in which rise of fault current is slightly gentle, i.e., for several seconds as in a ground fault of power transmission lines in the DC system, only a power transmission line associated with the ground fault is disconnected by using a high-speed circuit breaker and the circuit breaker is reclosed after recovery of the ground fault. This is described with reference to FIG. 15 showing an arrangement of a conventional DC power transmission system. FIG. 15 illustrates a typical DC power transmission system similar to that described in a book entitled "Electrical Engineering Handbook" edited by the Institute of Electrical Engineers of Japan. In FIG. 15, "1a" and "2b" denote different AC power systems, "2a" to "2d" denote converter transformers, "Da" and "Db" denote power converters used exclusively for rectification and formed by diodes, "3c" and "3d" denote separately excited power converters for inverters, which are formed by semiconductor devices, "Cba" to "CBh" denote DC circuit breakers, "6a" and "6b" denote neutral grounds and "7a" to "7d" denote DC power transmission lines.

Ordinary operation of the DC power transmission system is performed in a state where the DC circuit breakers CBa to CBh are closed. AC power supplied from the AC system 1a via the converter transformer 2a is rectified by the power converter Da used exclusively for rectification and is transmitted as DC power by the DC power transmission lines 7a to 7d. Then, the DC power is again converted to AC by the separately excited power converter 3c and is transmitted to the AC power system 1b through the transformer 2c. In the foregoing, only an upper half portion of FIG. 15 is described but the same applies to a lower half portion of FIG. 15. If a ground fault LG occurs in the DC power transmission line 7b, both of the DC circuit breakers CBb and CBf are interrupted promptly before its current fractures the power converter. Thus, the current of the DC power transmission line 7b is commutated to the DC power transmission line 7a temporarily and the DC circuit breakers are reclosed upon recovery of the ground fault so as to reinstate the DC power transmission system to ordinary operation.

By operating the DC power transmission system as described above, period during which transmission power drops is minimized. However, since it is extremely difficult to manufacture a extra-high voltage DC circuit breaker designed for the purpose of high-speed interruption, such disadvantages are incurred that the system becomes expensive and transmission voltage cannot be set high.

As a method of restraining ground fault current without using the DC circuit breaker, impedance grounding (capacitor grounding) is, needless to say, is known. Detailed description of this method is abbreviated here. When a ground fault occurs in case this method is adopted, voltage to ground at a side of a power transmission line, which is not subjected to the ground fault rises to twice an ordinary value, so that dielectric strength to ground of the DC line should be set at twice that required for ordinary power transmission. Therefore, since such an essential merit is lost that cost for constructing a power transmission line for DC power transmission is more inexpensive than that for AC power transmission, this method is seldom used for extra-high voltage DC power transmission.

As described above, the conventional semiconductor power converters have the drawbacks that the power semiconductor device is readily subjected to the heat cycle and the short-time overcurrent capability of the power semiconductor device is not so high as to be satisfactory.

Meanwhile, in the case of an applied apparatus in which the conventional semiconductor power converter is applied to a DC power transmission system, such an inconvenience is incurred that in order to prevent drop of electric energy to be transmitted in the system at the time of a ground fault, the high-speed circuit breakers for two circuits and the power transmission lines for two circuits are required to be provided, which is expensive.

DISCLOSURE OF INVENTION

A semiconductor power converter for performing power conversion between an input power system and an output power system by controlling current by the use of a power semiconductor device, according to the present invention comprises: a cooling liquid path for cooling with cooling liquid the power semiconductor device which generates heat; a liquid delivery means for delivering the cooling liquid through the cooling liquid path; a liquid temperature detecting means for detecting a temperature of the cooling liquid after cooling of the power semiconductor device; and a flow control means for controlling a flow rate of the cooling liquid via the liquid delivery means; wherein continuous and variable control of the flow rate of the cooling liquid is performed by the flow control means in accordance with the temperature of the cooling liquid detected by the liquid temperature detecting means.

Meanwhile, a temperature difference detecting means for detecting a difference between a temperature of the cooling liquid prior to cooling of the power semiconductor device and that after cooling of the power semiconductor device is further provided such that the flow rate of the cooling liquid is controlled by the flow control means in accordance with the temperature difference detected by the temperature difference detecting means.

Meanwhile, the liquid temperature detecting means is replaced by an electricity detecting means for detecting a quantity of electricity corresponding to heat release of the semiconductor power converter such that the flow rate of the cooling liquid is controlled by the flow control means in accordance with a detection output of the electricity detecting means.

Meanwhile, the electricity detecting means is replaced by a command means for issuing a command on the quantity of electricity corresponding to the heat release of the semiconductor power converter.

Meanwhile, the liquid temperature detecting means is replaced by a device temperature detecting means for detecting a temperature of the power semiconductor device.

Meanwhile, the device temperature detecting means calculates a heat release value or the temperature of the power semiconductor device from hysteresis of the current of the power semiconductor device.

Meanwhile, the output power system is an AC motor and the quantity of electricity is a quantity associated with a torque of the AC motor.

The flow control means includes a storage means for storing emergency cooling liquid, a valve means for delivering to the cooling liquid path the emergency cooling liquid stored in the storage means, a signal generating means for generating a signal when the current flowing through the power semiconductor device exceeds a predetermined level and an emergency cooling command circuit for opening the valve means in response to the signal of the signal generating means.

Meanwhile, a cooling apparatus for cooling the emergency cooling liquid to a temperature lower than a temperature of the cooling liquid prior to cooling of the power semiconductor device is further provided.

Meanwhile, the flow rate of the cooling liquid is increased by the flow control means in response to the signal of the signal generating means.

Meanwhile, in an applied apparatus of the power semiconductor power converter, a DC power transmission system for connecting a plurality of AC power systems by DC lines of positive and negative poles is formed and upon detection of a ground fault on one of the DC lines of positive and negative poles, conversion of the semiconductor power converter at one pole side close to the ground fault is stopped and an output of the semiconductor power converter at the other normal pole side is increased and the emergency cooling liquid is delivered by controlling the valve means of the semiconductor power converter at the normal pole side.

Meanwhile, a semiconductor power converter for performing power conversion between an input power system and an output power system by controlling current by the use of a power semiconductor device, comprises: an air cooling means for cooling with air the power semiconductor device which generates heat; an air velocity control means for performing continuous and variable control of an air velocity of the air cooling means; and at least one of (1) an electricity detecting means for detecting a quantity of electricity corresponding to heat release of the power semiconductor device, (2) a command means for issuing a command on the quantity of electricity corresponding to the heat release of the power semiconductor device and (3) a temperature detecting means for detecting a temperature of the power semiconductor device; wherein continuous and variable control of the air velocity is performed by the air velocity control means in accordance with an output of one of the (1), (2) and (3).

BRIEF DESCRIPTION OF DRAWINGS

FIG. 2b is a graph of temperature and fan speed characteristics of the circuit of FIG. 2a.

BEST MODE FOR CARRYING OUT THE INVENTION (First Embodiment)

Figure 1:
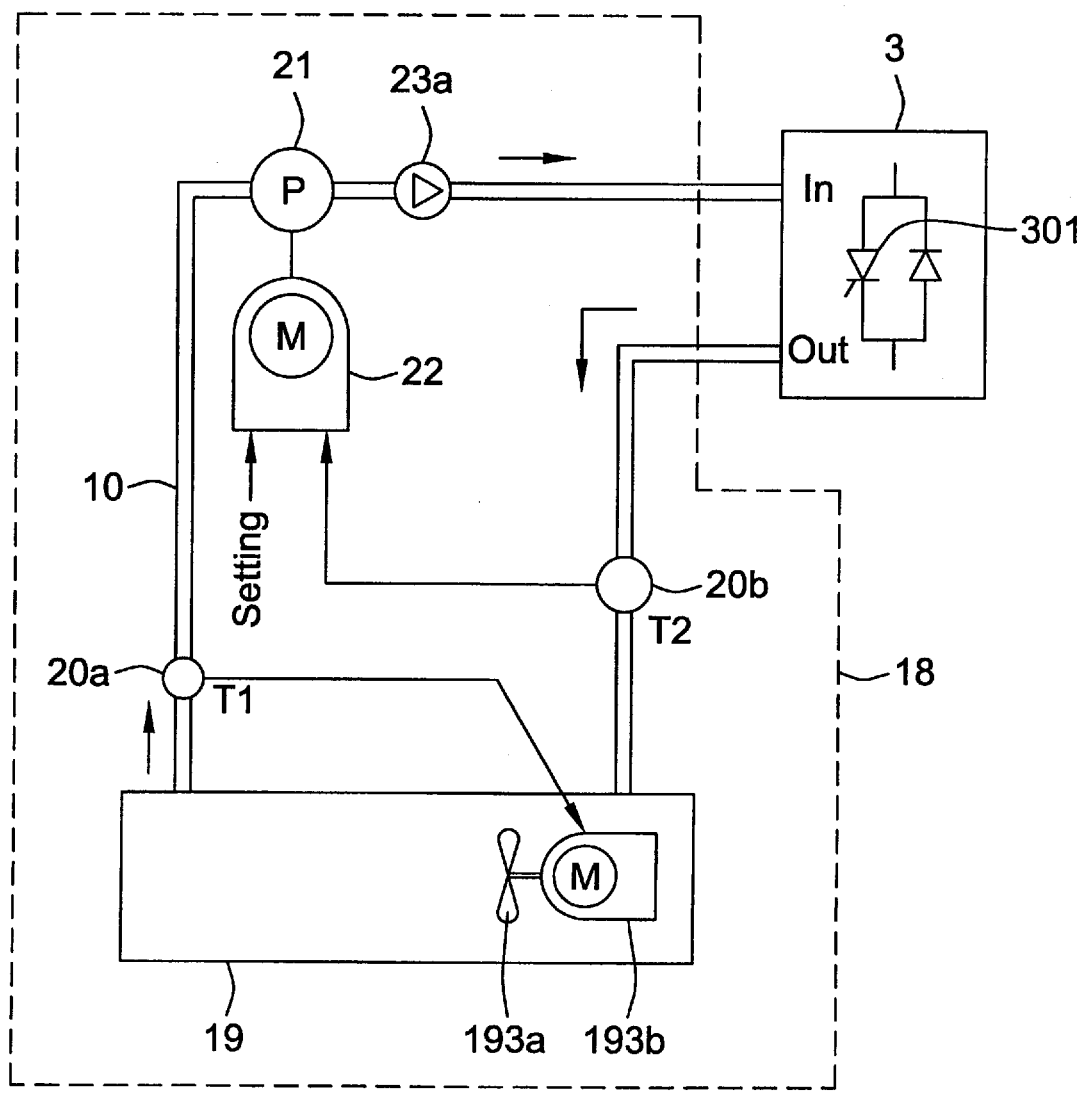
FIG. 1 is a view showing an arrangement of a semiconductor power converter according to a first embodiment of the present invention.

A semiconductor power converter according to a first embodiment of the present invention is shown in FIG. 1. In FIG. 1, "3" is a main portion of the semiconductor power converter, "301" is a power semiconductor device referred to also as a "semiconductor stack" and including a path for delivering cooling liquid, "10" is a liquid path (pipe) for carrying the cooling liquid referred to also as "refrigerant" below and "18" is a refrigerant supply system for the semiconductor stack 301. In FIG. 1, the refrigerant supply system 18 supplies the cooling liquid by way of the pipe 10. "19" is a heat exchanger for maintaining quality of the refrigerant and performing heat exchange. The refrigerant flows in the pipe 10 in the direction of the arrow. "20a" is a sensor (temperature detecting means) for detecting temperature of the refrigerant at an inlet side of the stack 301, namely, prior to cooling of the stack 301, while "20b" is a sensor (temperature detecting means) for detecting temperature of the refrigerant at an outlet side of the stack 301, namely, after cooling of the stack 301. "193a" is a variable speed fan for cooling the refrigerant in the heat exchanger and "193b" is a temperature controller which controls the variable speed fan 193a so as to keep a detection temperature T1 of the temperature sensor 20a constant. "21" is a refrigerant flow control pump (liquid delivery means), "22" is a variable-speed drive (flow control means) for the refrigerant flow control pump 21 and "23a" is a check valve.

Then, its operation is described with reference to FIG. 1. The refrigerant is fed from the heat exchanger 19 to an inlet IN of the stack 301 of the semiconductor power converter 3 by the refrigerant flow control pump 21 and the refrigerant which has absorbed heat of the stack 301 is discharged from its outlet OUT. Then, the refrigerant is returned to the heat exchanger 19 and heat of the refrigerant is released to external air by the variable speed fan 193a. Meanwhile, an ion exchanger for removing impurities in a refrigerant tank or the refrigerant may be provided in the course of the pipe 10 but its illustration and description are abbreviated due to its less relevance to the present invention.

Figure 2A:
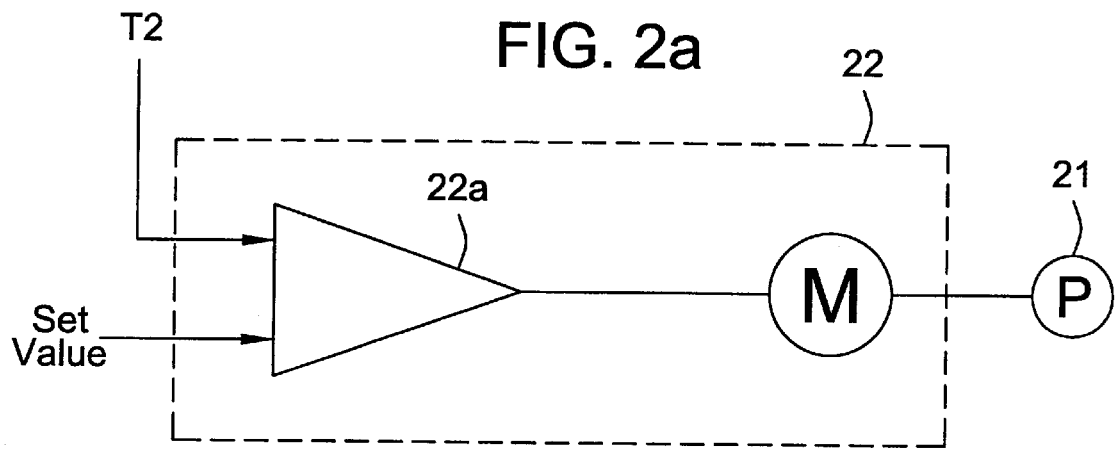
FIG. 2a is a fragmentary detail view of FIG. 1
Figure 2B:
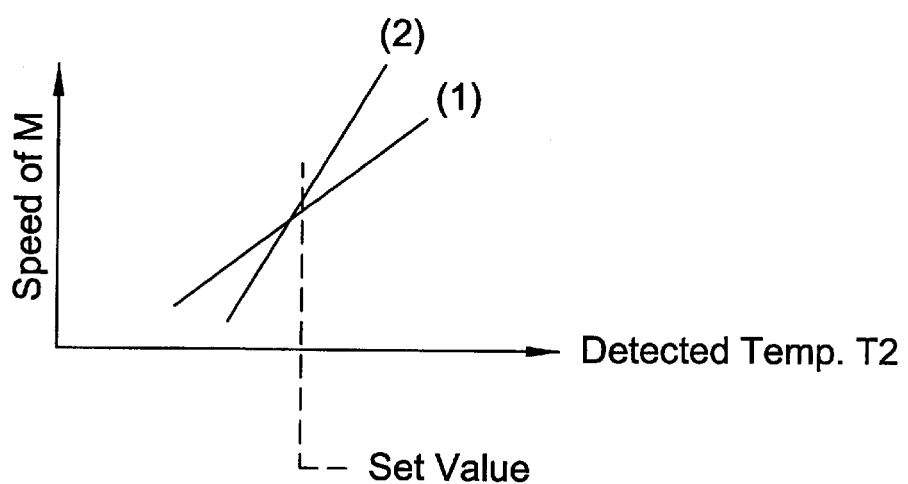

The variable-speed drive 22 controls flow rate of the refrigerant flow control pump 21 continuously such that a temperature T2 of the refrigerant (a detection temperature of the temperature detecting means 20b) after cooling of the stack 301 assumes a predetermined value. Namely, the variable-speed drive 22 performs stepless variable speed control so as to accelerate and decelerate rotation of the pump 21 in accordance with the temperature T2 when the temperature T2 is higher than and lower than the predetermined temperature, respectively. A control configuration and characteristics of the variable speed control unit 22 are shown in FIGS. 2a and 2b, respectively. "22a" in FIG. 2 is an arithmetic amplifier. At this time, as speed change rate of the pump 21 relative to temperature error, (gain gradient), becomes higher as shown by the line (2) instead of the line (1) in FIG. 2b, its temperature control accuracy is higher.

Speed of the variable speed fan 193a of the heat exchanger 19 is controlled so as to make the temperature T1 of the refrigerant substantially constant. If heat dissipation capacity of the heat exchanger 19 is sufficient and the temperature T1 of the refrigerant at an outlet of the heat exchanger 19 is stable, temperature of the stack 301, therefore, a heat cycle of device temperature of the semiconductor device is lessened greatly by the above mentioned constant control of the temperature T2.

In FIG. 1, the inlet temperature T1 of the refrigerant is detected by the temperature sensor 20a and temperature of the refrigerant is controlled to T1 by the temperature controller 193b and the variable speed fan 193a. However, if the variable speed fan has a sufficient cooling capability even at a constant rotational speed, these devices are not required to be provided necessarily.

(Second Embodiment)

Figure 3:
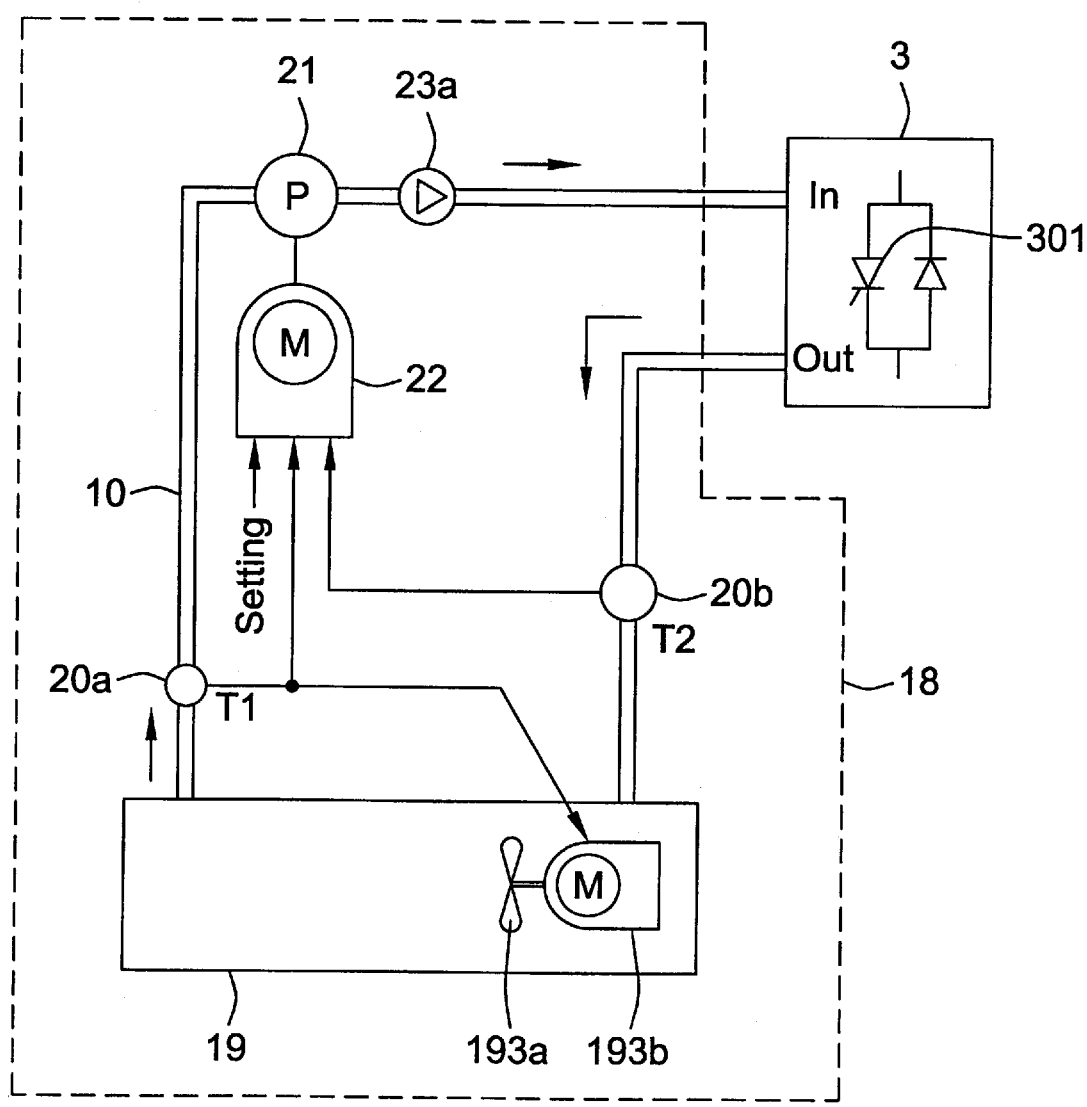
FIG. 3 is a view showing an arrangement of a semiconductor power converter according to a second embodiment of the present invention.
Figure 4:
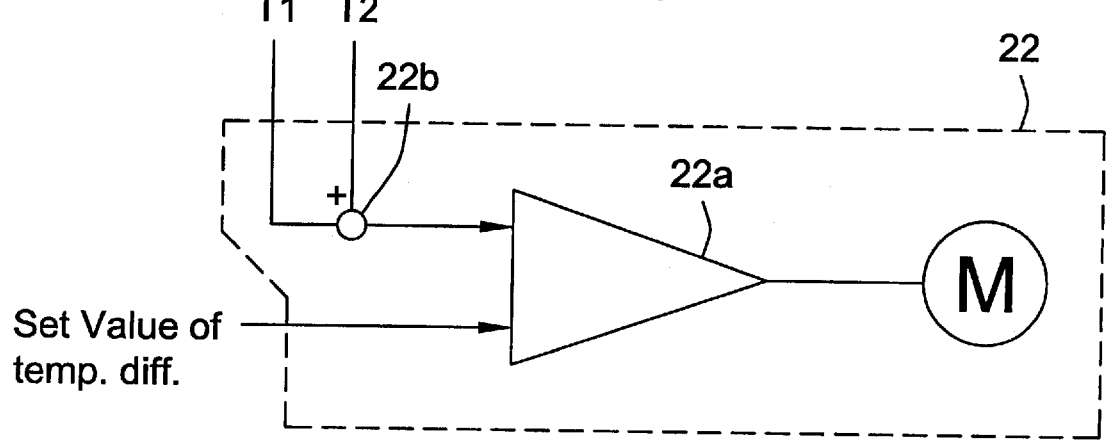
FIG. 4 is a fragmentary detail view of FIG. 3.

In case capability of the heat exchanger 19 is not sufficient and variations of the temperature T1 of the refrigerant prior to cooling of the stack 301 are great, such a phenomenon may happen in which setting of flow rate of the refrigerant at a maximum value does not lead to drop of the temperature T2 through the constant control of the temperature T2 performed in the first embodiment. Therefore, in such a case, the inlet temperature T1 and the outlet temperature T2 of the refrigerant may be detected such that flow rate of the refrigerant is controlled in accordance with a difference between the inlet temperature T1 and the outlet temperature T2, i.e., $\Delta T=T2-T1$ as shown in FIGS. 3 and 4. Thus, since burden of a heat cycle is lessened further, such an effect can be gained that its reliability and service life are improved further.

(Third Embodiment)

In order to lessen burden of a heat cycle of the semiconductor device, constant control of device temperature or temperature of a junction of the device is more effective than constant temperature control of a heat sink.

Loss of the power semiconductor device depends on operating current I and operating voltage V. Namely, momentary voltage and momentary current are monitored and the loss L can be calculated based on the momentary voltage and the momentary current. In order to gain effect of the present invention, approximate calculation is sufficient for calculating the loss. Therefore, the loss can be calculated from either a calculation result table prepared preliminarily for respective operational modes in view of switching conditions on the basis of the power source voltage V of the power converter and the converter output current I or a known approximate calculation formula.

Figure 5:
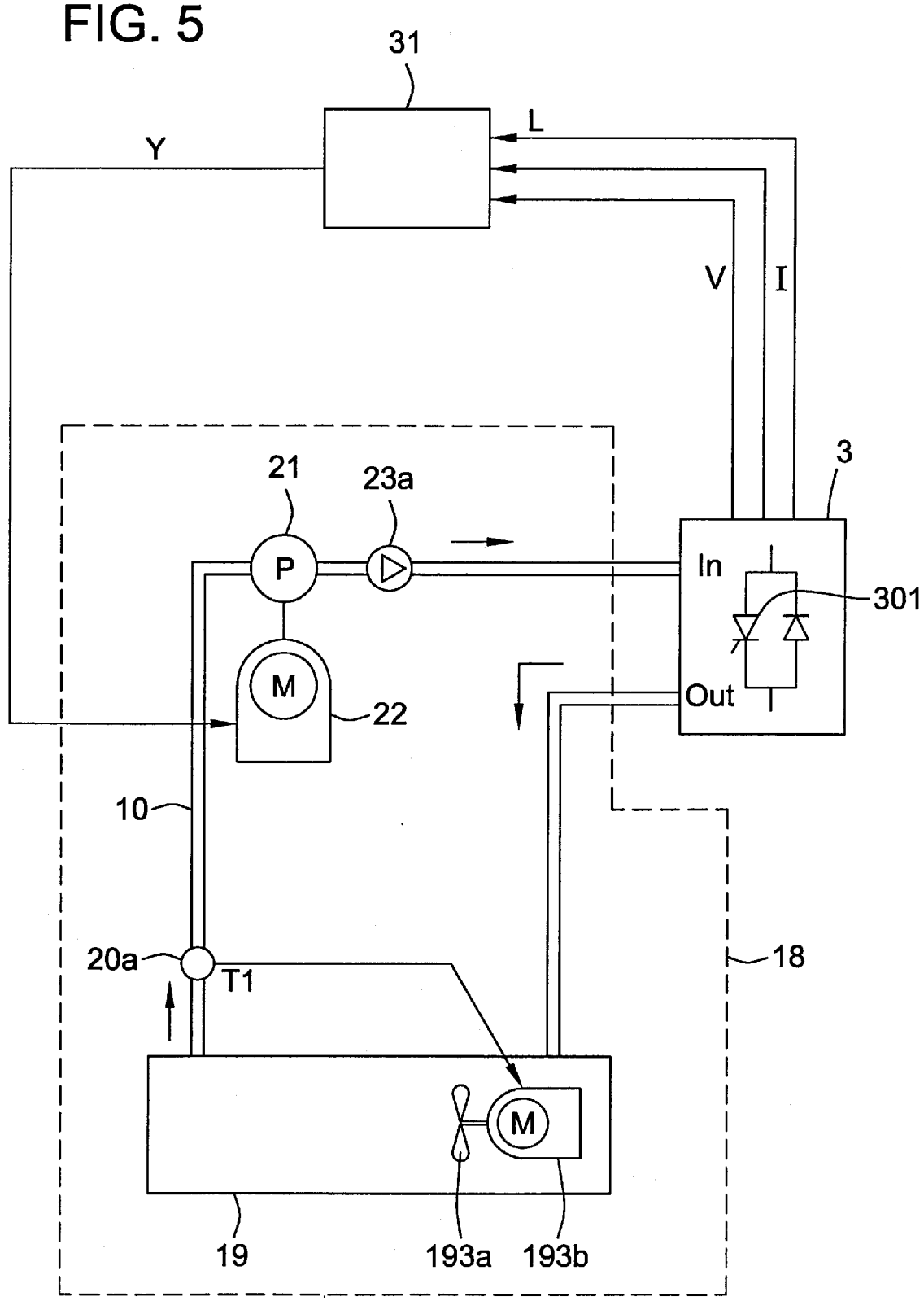
FIG. 5 is a view showing an arrangement of a semiconductor power converter according to a third embodiment of the present invention.

Real-time information required for performing these processings can be easily obtained from the semiconductor power converter 3. In FIG. 5, "31" denotes a calculation means for calculating correlative amount of rise of temperature of the semiconductor junction. FIG. 5 illustrates that a signal Y corresponding to rise of the temperature of the junction is obtained from the thus obtained loss L by the calculation means 31 and flow rate of the refrigerant is controlled in accordance with this signal Y, for example, the number of revolutions of the pump 21 is controlled in proportion to the signal Y.

Figure 6:
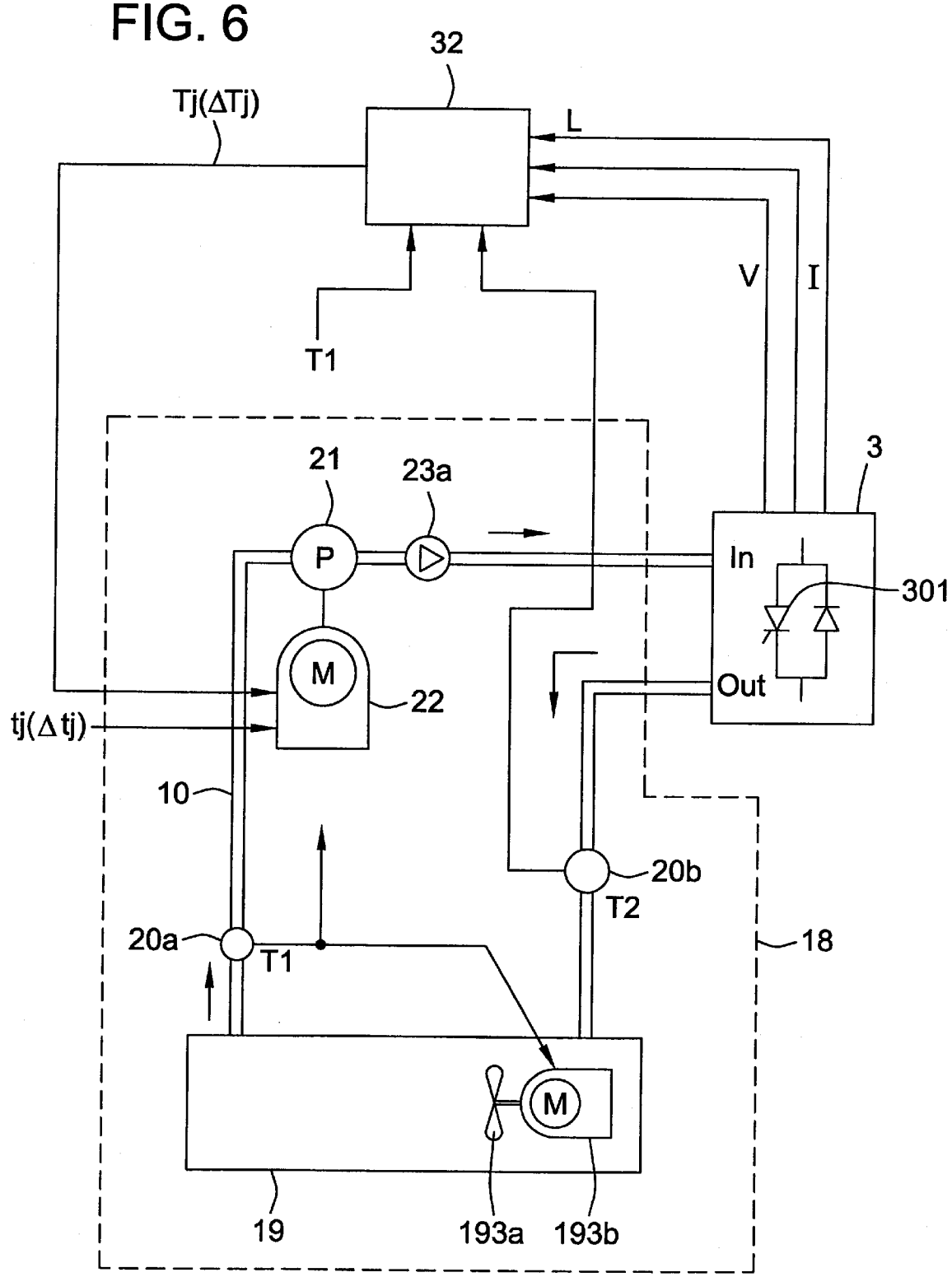
FIG. 6 is a view showing an arrangement in which a portion of FIG. 5 is modified.

A configuration which is made with higher precision than that of FIG. 5 is shown in FIG. 6. In FIG. 6, a calculation means 32 for a temperature Tj of the semiconductor junction or its rise $\Delta Tj$ performs estimative calculation of the temperature Tj of the semiconductor junction from the outlet temperature T2 or the inlet temperature T1 of the refrigerant and the amounts V, I and L associated with heat release value. Then, the variable speed control unit 22 controls flow rate of the refrigerant such that the temperature Tj or the rise $\Delta Tj$ obtained by the above described calculation follows a command value tj or $\Delta tj$.

By the arrangements of FIGS. 5 and 6, since temperatures of main portions such as the junction, a wafer and a cathode face in which the heat cycle is problematical can be controlled more directly and with higher precision, burden of the heat cycle is lessened further, namely, temperature variations are reduced, so. that such an effect can be achieved that its reliability and service life are improved further.

(Fourth Embodiment)

In the first to third embodiments, the heat cycle is relatively gentle in the case where temperature changes of the power semiconductor device are caused by normal load variations or variations of air temperature with time. However, changes of output current of the semiconductor power converter 3 are not necessarily so gentle as those of the first to third embodiments. For example, in case the semiconductor power converter 3 is associated with a power system such as a DC power transmission system, the semiconductor power converter should be burdened with whole of DC power transmission capability including fault current, for a short period of several to dozens of cycles so as to cope with an emergency, namely, until removal of a fault portion is completed in the case of a ground fault as described earlier with respect to prior art.

In such short-time overload, overcurrent capability of the semiconductor device relative to overload current falling in a time region of the above mentioned ground fault or the like can be raised by rapidly cooling the power semiconductor device 3.

Figure 7:
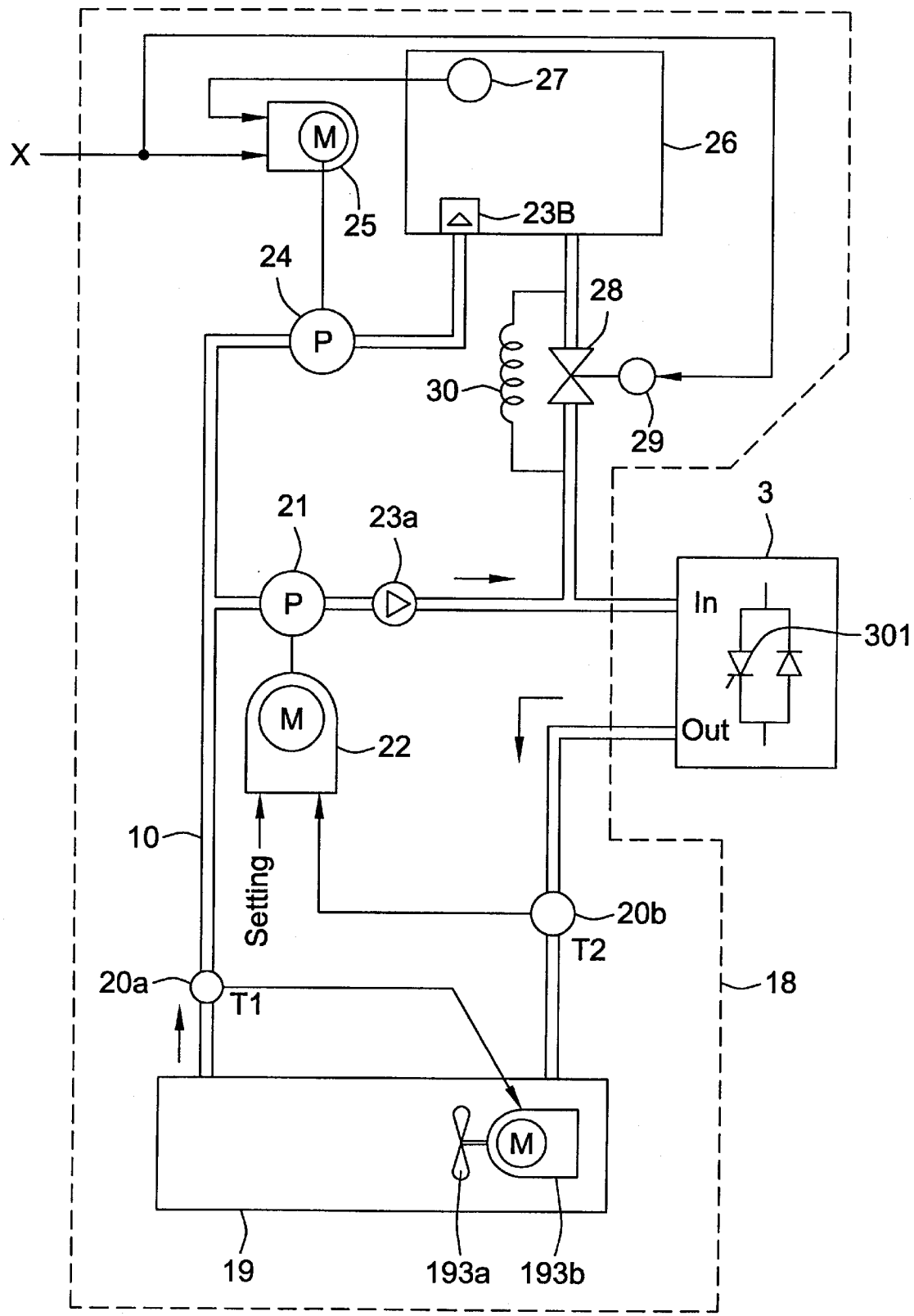
FIG. 7 is a view showing an arrangement of a semiconductor power converter according to a fourth embodiment of the present invention.

In FIG. 7, a system for rapidly cooling the semiconductor device is provided for the above mentioned purpose, namely, for the purpose of raising short-time overload capacity. In FIG. 7, "26" is an emergency refrigerant storage tank (emergency refrigerant storage means), "23b" is a check valve, "24" is an auxiliary refrigerant pump, "25" is a drive control unit for the auxiliary refrigerant pump 24, "27" is a detector for detecting storage pressure or storage amount in the emergency refrigerant storage tank 26, "28" is an emergency cooling liquid delivery valve and "29" is a control mechanism for the valve 28, which acts also as an emergency cooling command circuit.

Meanwhile, "30" is a metabolic refrigerant bypass capillary for causing a small amount of the refrigerant to successively flow therethrough so as to prevent change of properties of the refrigerant in the storage tank 26 due to residence of the refrigerant in the storage tank 26. The valve 28 may also be slightly opened at all times in place of the bypass capillary 30. In FIG. 7, when the short-time overload capacity of the semiconductor power converter 3 is required to be raised as described above, namely, the ground fault referred to above occurs in DC power transmission, a fault signal X is outputted from a signal generating means (not shown) and is used here as an emergency cooling command.

Then, its operation is described. If a load is applied to the semiconductor power converter 3 or an overload such as a ground fault is applied to a power transmission line (or an overload command is given to the semiconductor power converter 3), the signal X is outputted from the signal generating means (not shown). In response to the signal X, the valve control mechanism (emergency cooling command circuit) 29 outputs the emergency cooling command so as to open the emergency cooling liquid delivery valve 28 such that the refrigerant stored in the refrigerant storage tank 26 is emergently released to the stack 301, thereby resulting in sharp rise of cooling capability.

As a result, since short-time overload capacity of the semiconductor can be raised temporarily, rise of its temperature can be restrained. The refrigerant storage tank 26 includes a piston (not shown) or the like depressed by inert gas or a pressure spring and the refrigerant is introduced into the tank 26 under pressure by the pump 24 such that the tank 26 is kept under pressure at all times. By this pressure, the refrigerant is intensely released to the stack 301 concurrently with opening of the valve 28. When pressure in the tank 26 drops subsequently, the pressure detector 27 detects the pressure drop and the pump 24 is started by this signal of the detector 27 such that the refrigerant is stationarily supplied at a high flow rate continuously.

Therefore, the refrigerant in an amount corresponding to a short period required for priming the pump 24 may be stored in the refrigerant storage pump 26. Since an emergency happens only rarely, deterioration of the refrigerant may advance if the refrigerant is left in the tank for a long term. Therefore, a small amount of the refrigerant is discharged on purpose by way of the capillary 30. Furthermore, the check valve 23a is provided for preventing back flow of the refrigerant towards the refrigerant flow control pump 21 at the time the emergency refrigerant delivery valve 28 has been opened. The check valve 23b is provided also at the refrigerant storage tank 26 so as to maintain pressure in the tank 26 even at the time of stop of the pump 24.

Figure 8:
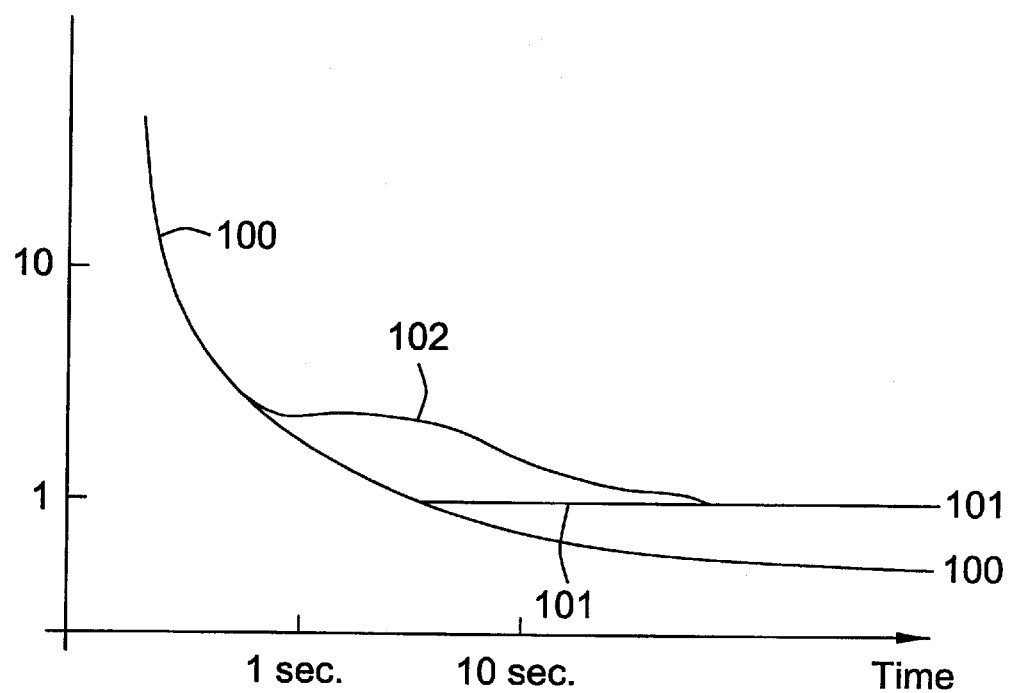
FIG. 8 is a view explanatory of characteristics of FIG. 7.

Capacity of the refrigerant storage tank 26 is limited. Thus, even if the tank 26 is pressurized by the pump 24 in response to discharge of the cooling liquid, pressure in the tank 26 drops in the meantime. Therefore, flow rate of the cooling liquid, which is obtained at the time of start of discharge of the cooling liquid, does not continue indefinitely. Accordingly, there should be a duration effective for raising the short-time overload capacity in this method. In order to facilitate understanding of this conclusion, FIG. 8 illustrates changes of the short-time overload capacity of the power semiconductor stack 301 due to cooling. In FIG. 8, "100" represents the short-time overload capacity of the stack 301 with no cooling, "101" represents the short-time overload capacity in the case where cooling corresponding to an average rated power has been performed and "102" represents the short-time overload capacity in the case where emergency cooling of FIG. 7 is performed. A duration in which the characteristics 102 prevail is affected by capacity of the tank 26.

On the other hand, if the tank has such a capacity as to maintain its flow rate for an acceleration completion period of 0.3 to 1 sec. in the motor pump 24, overload capacity can be maintained for a long time in accordance with capability of the motor pump 24. Namely, the tank 26 has an effect of rapidly raising cooling capability during delay of the acceleration period of the pump.

Furthermore, if the acceleration period is shortened to dozens of ms. by forming the variable speed motors 24 and 25 by a low-inertia motor or the like in the above mentioned embodiment and the following embodiments in order to improve the overload capacity requiring rapid rise, the tank can also be eliminated.

(Fifth Embodiment)

Figure 9:
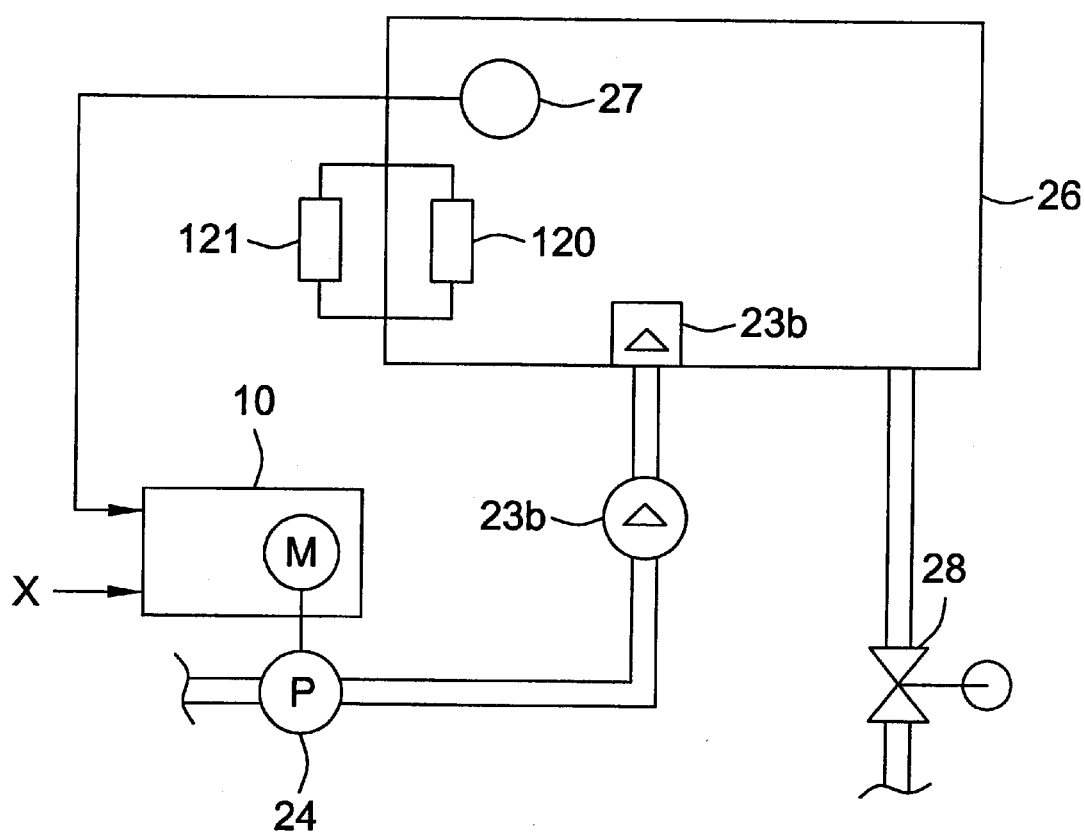
FIG. 9 is a view showing an arrangement of a semiconductor power converter according to a fifth embodiment of the present invention.

FIG. 9 shows an arrangement in which the effect of the emergency cooling method of the fourth embodiment is further heightened. In FIG. 9 illustrating only a periphery of the refrigerant storage tank 26 of FIG. 7, other portions are similar to those of FIG. 7 and thus, the illustration is abbreviated. In FIG. 9, "120" is a cooler for keeping temperature of the refrigerant in the emergency refrigerant storage tank 26 as low as possible, for example, lower than the temperature T1 of the refrigerant in the pipe 10 and "121" is a radiator. Thus, emergency cooling capability is raised further. As a result, capability to cope with an emergency and the short-time overload capacity are improved further. In this case, it is preferable that the tank 26 is a so-called heat insulation tank having excellent heat insulating properties.

(Sixth Embodiment)

Figure 10:
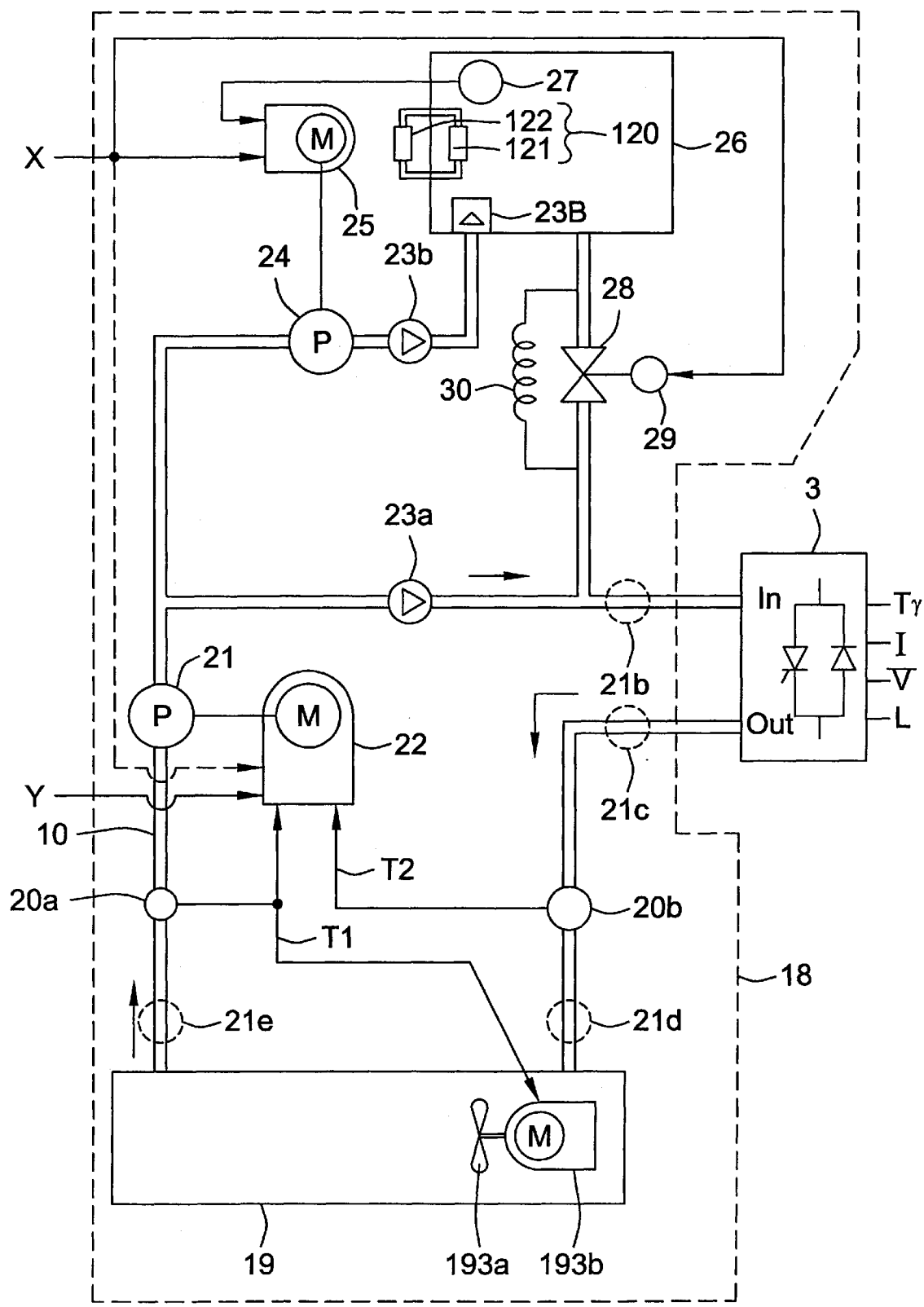
FIG. 10 is a view showing an arrangement of a semiconductor power converter according to a sixth embodiment of the present invention.

Another embodiment of the present invention is shown in FIG. 10. In that the refrigerant flow control pump 21 and the auxiliary emergency pump 24 are connected to each other in series, FIG. 10 is different from FIG. 7 of the fourth embodiment in which the two pumps are connected to each other in parallel. Since the pumps are connected to each other in series, the pumps may be disposed at any one of locations 21b, 21c, 21d and 21e in addition to the locations shown in FIG. 10 and thus, it is firstly possible to gain such an effect that degree of freedom of layout of the pumps is raised.

In case pressure loss of the pipe 10 and the stack 301 is small when the auxiliary emergency pump 24 is actuated, flow rate of the refrigerant increases sufficiently even if the pumps 21 and 24 are connected to each other in parallel. However, if the pressure loss is large, a predetermined flow rate cannot be obtained if delivery pressure is not increased in accordance with increase of the flow rate.

In the fourth embodiment of FIG. 7, since the refrigerant storage tank 26 supplies this pressure, capacity of the flow rate of the pump 24 has degree of freedom. On the other hand, since the tanks 21 and 24 are connected to each other in parallel, the check valve 23a is closed when pressure in the tank 26 is high, while the check valve 23b is closed when pressure in the tank 26 drops. As a result, there is a risk that the refrigerant is supplied by only one of the two refrigerant flow paths at all times.

On the other hand, in FIG. 10, the above mentioned pressure loss may be shared by both of the pumps 21 and 24. Therefore, it is possible to achieve an effect that flow rate of the refrigerant in case of an emergency can be increased positively.

(Seventh Embodiment)

Figure 11:
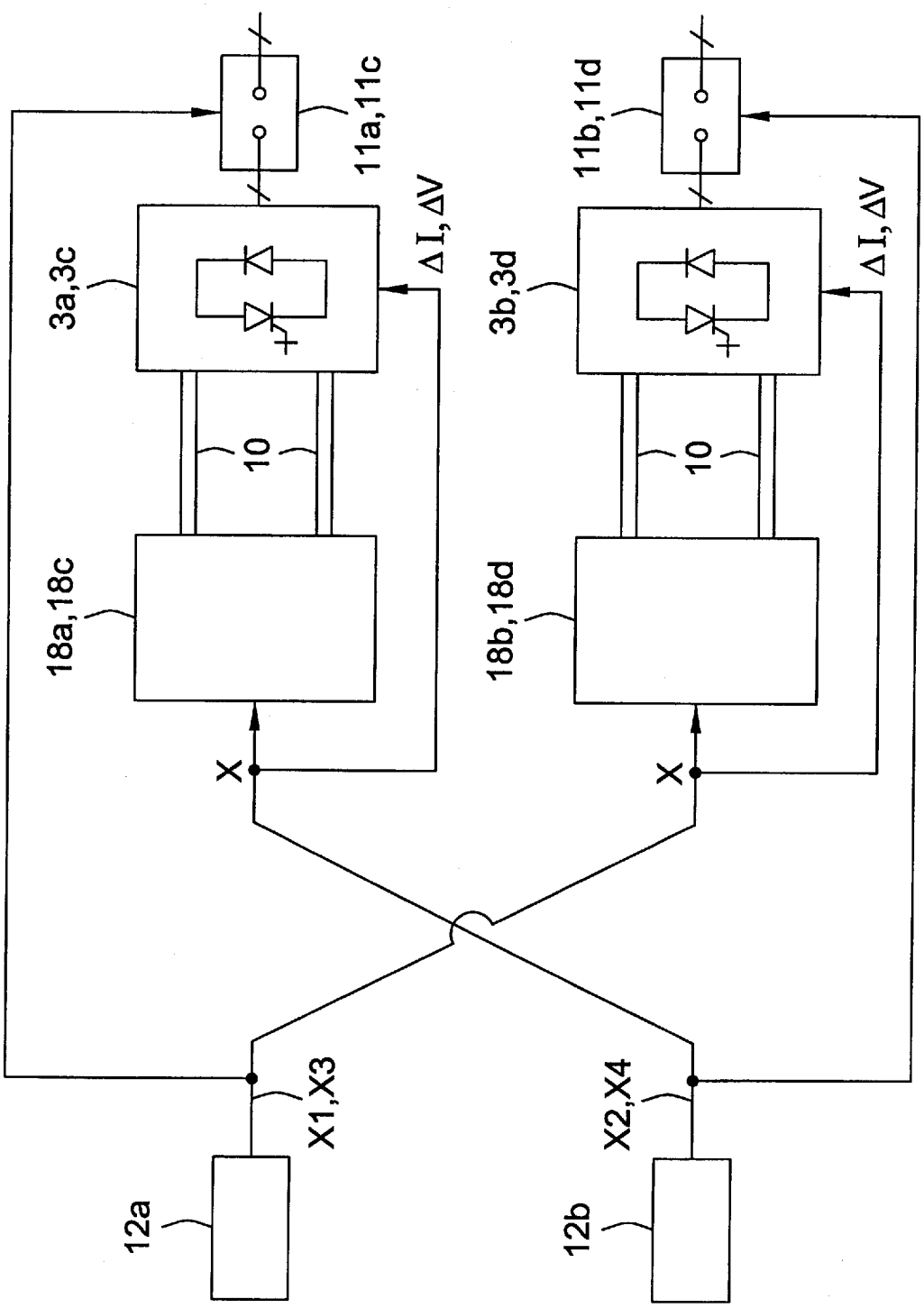
FIG. 11 is a view showing a DC power transmission system according to a seventh embodiment of the present invention.
Figure 12:
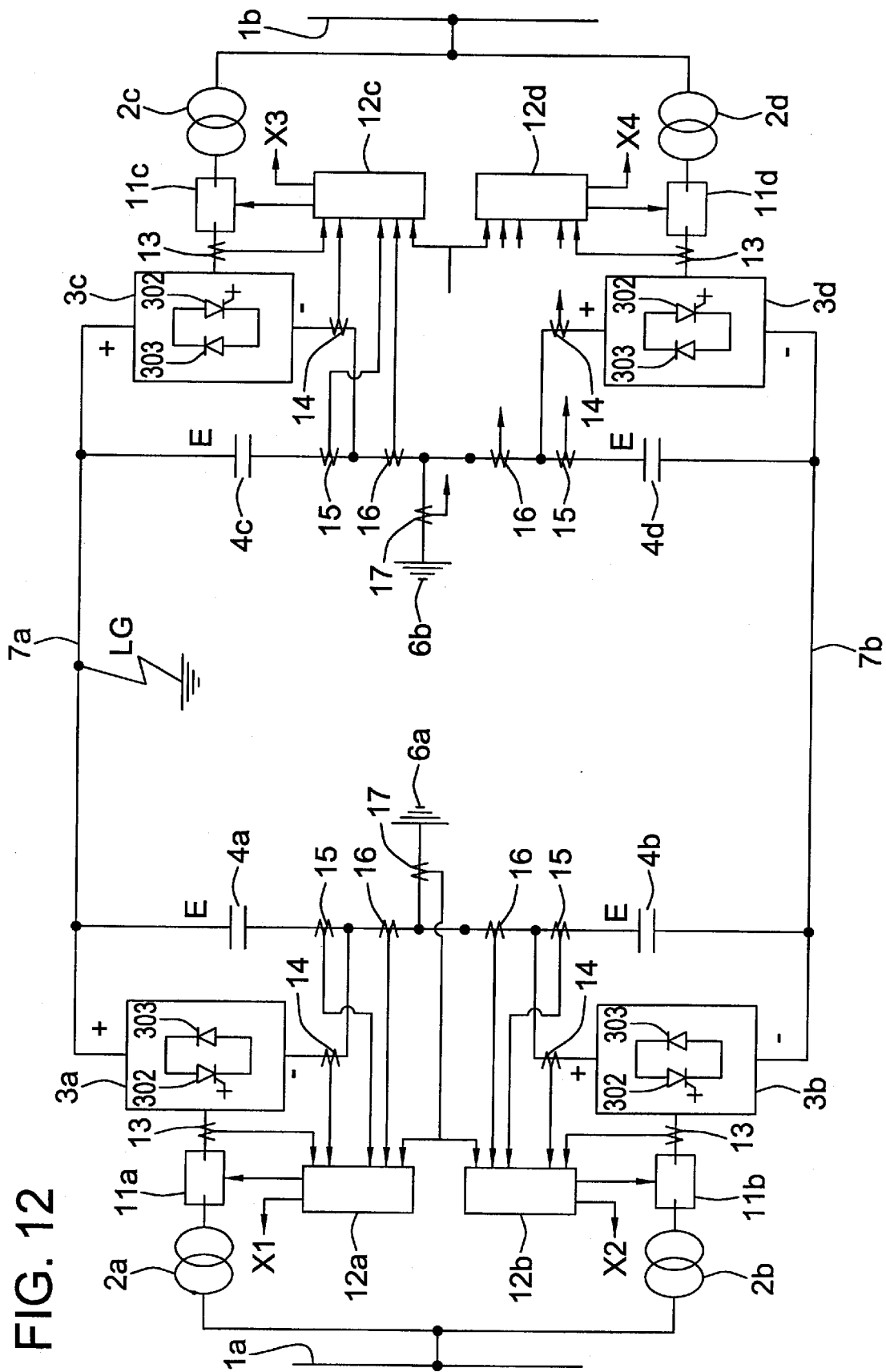
FIG. 12 is a detail view of FIG. 11.
Figure 13:
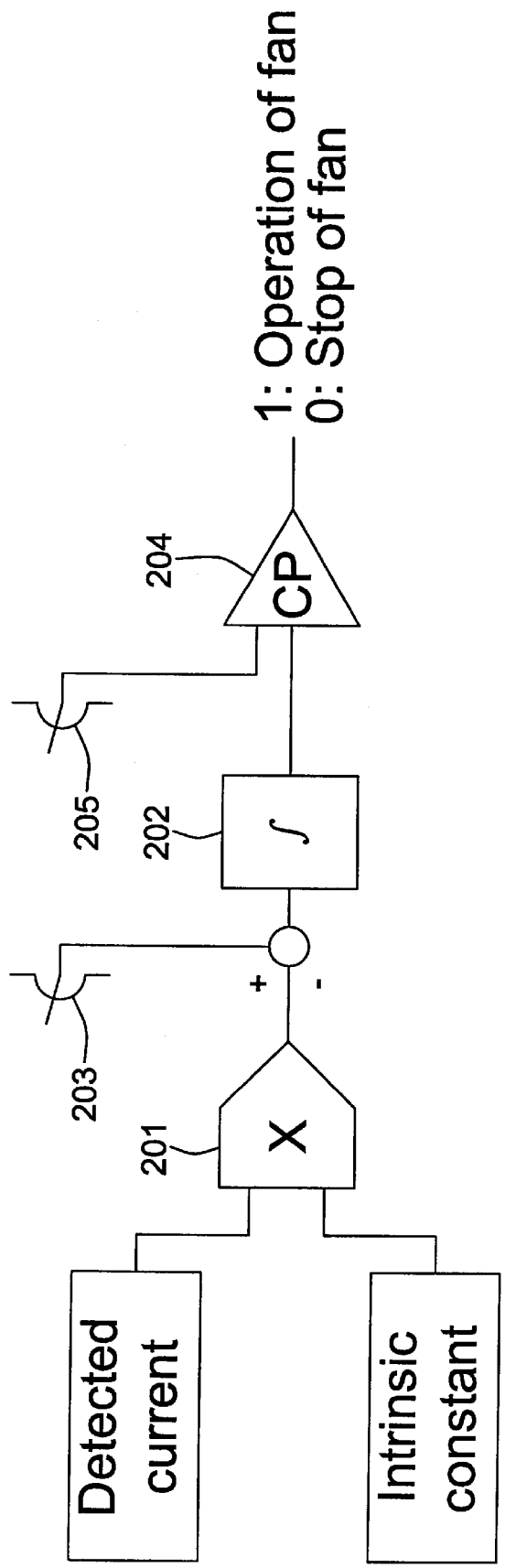
FIG. 13 is a view explanatory of a cooling system for a conventional semiconductor power converter.
Figure 14:
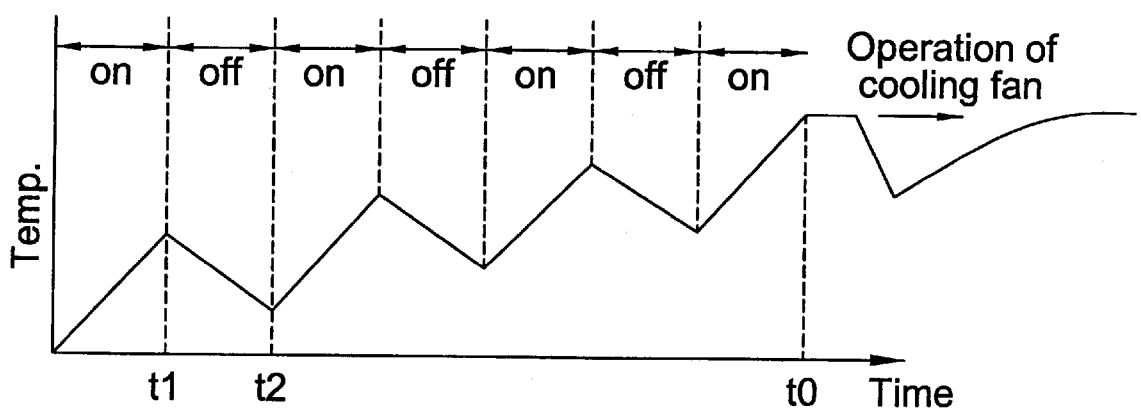
FIG. 14 is a view explanatory of characteristics of FIG. 13.

A concrete example of application of control of the system by the command X mentioned in the fourth to sixth embodiments is described with reference to FIGS. 11 and 12. In FIGS. 11 and 12, "3a to 3d" are semiconductor power converters, "4a to 4d" are DC capacitors, "6a and 6b" are ground, "7a and 7b" are positive and negative power transmission lines, "18a to 18c" are cooling liquid supply systems corresponding to the semiconductor power converters 3a to 3d, "10" is a refrigerant pipe, "11a to 11d" are circuit breakers at an AC side of the semiconductor power converters and "12a to 12d" are command means for outputting emergency cooling commands Xa to Xd.

"302" is a switching device in the semiconductor power converter, "303" is a reverse-current carrying device (diode) and "13 to 17" are current detecting sensors (current detecting means) inserted at the illustrated locations. Meanwhile, "18a to 18d" include, for example, the emergency cooling system shown in one of FIGS. 7 to 10.

Then, its operation is described. In case a ground fault LG occurs on the DC line 7a, overcurrent flows through the semiconductor power converter 3a and the DC capacitor 4a, the power transmission line 7a, the ground fault point LG and the current detecting means 14 to 17 so as to return to the semiconductor power converter 3a and the DC capacitor 4a at the original location. At the same time, overcurrent also flows through the current detecting means 13 provided on the AC line of the converter 3a.

Likewise, overcurrent flows through the semiconductor power converter 3c and the DC capacitor 4c, the power transmission line 7a, the ground fault point LG and the current detecting means 14 to 17 so as to return to the semiconductor power converter 3c and the DC capacitor 4c at the original location. At the same time, overcurrent also flows through the current detecting means 13 provided on the AC line of the converter 3c.

On the basis of one or a plurality of ones of outputs of the current detecting means, the command means 12a or 12c outputs the command X1 or X3 (alternatively, the command means 12a and 12c may output the commands X1 and X3). Since overcurrent closer to the ground fault point LG increases more quickly, the command means 12 closer to the ground fault point LG outputs the command X earlier. Meanwhile, since current of the DC capacitor 4 increases more quickly than converter current flowing through the AC circuit, outputs of the current detecting sensors 15, 16 and 17 for detecting discharge current of the capacitors 4 increase quickly.

On the other hand, if monitoring reveals that these outputs exceed a predetermined value, the emergency commands X1 or X3 is outputted so as to stop operation of the corresponding semiconductor power converter 3a or 3c by so-called gate interrupting operation.

Simultaneously, the emergency refrigerant output valves 28 of the cooling liquid supply systems 18b and 18d connected with the semiconductor power converters 3b and 3d are opened so as to increase flow rate of the refrigerant. Moreover, in response to the signals X1 and X3, output currents of the normal semiconductor power converters 3b and 3d are increased by quantity corresponding to that of current shouldered by the semiconductor power converters 3a and 3c until then. Meanwhile, at the same time, flow rate of the pump 21 may also be increased.

By the foregoing arrangement, cooling capability is raised sharply, so that quantity of power which can be transmitted by the normal semiconductor power converter can be increased and thus, transmission power of the whole power transmission system can be maintained.

If the ground fault current LG of the DC power transmission line 7a disappears and insulation to the earth is recovered, operation of all the semiconductor power converters 3 is restarted by reclosing the circuit breakers 11. The increased transmission power of the normal poles is naturally recovered to the original level and the cooling system also returns to its original level sequentially. As a result, reliability of power supply of the power transmission system can be upgraded in a wide sense.

In the above description, the normal semiconductor power converters shoulder a whole of the interrupted current. However, it is needless to say that even if, for example, one-third or two-thirds of the interrupted current is shouldered, the effects can be gained to some extent.

Also in an AC system, a total transmission power may decrease to its two-thirds as in a fault of short-time one-phase opening in three-phase AC power transmission. Therefore, in order to secure two-thirds of the transmission power by only the normal poles, the following relation is obtained.

(Total current)/(Ordinary current of one side)=($2/3$)/($1/2$)=$4/3$

Namely, if the power converters of the one side are capable of performing short-time overload power transmission which is $4/3$ times that of ordinary operation, reliability equivalent to that of the AC power transmission system can be obtained in DC power transmission. At this time, if device loss is approximated to be proportional to square of the current, cooling capability may be increased to about $16/9$ times. Assuming that cooling capability should be increased twice in view of its allowance, the above calculative target can be fully achieved when not only flow rate of the refrigerant is set twice but temperature of the refrigerant is lowered.

Figure 15:
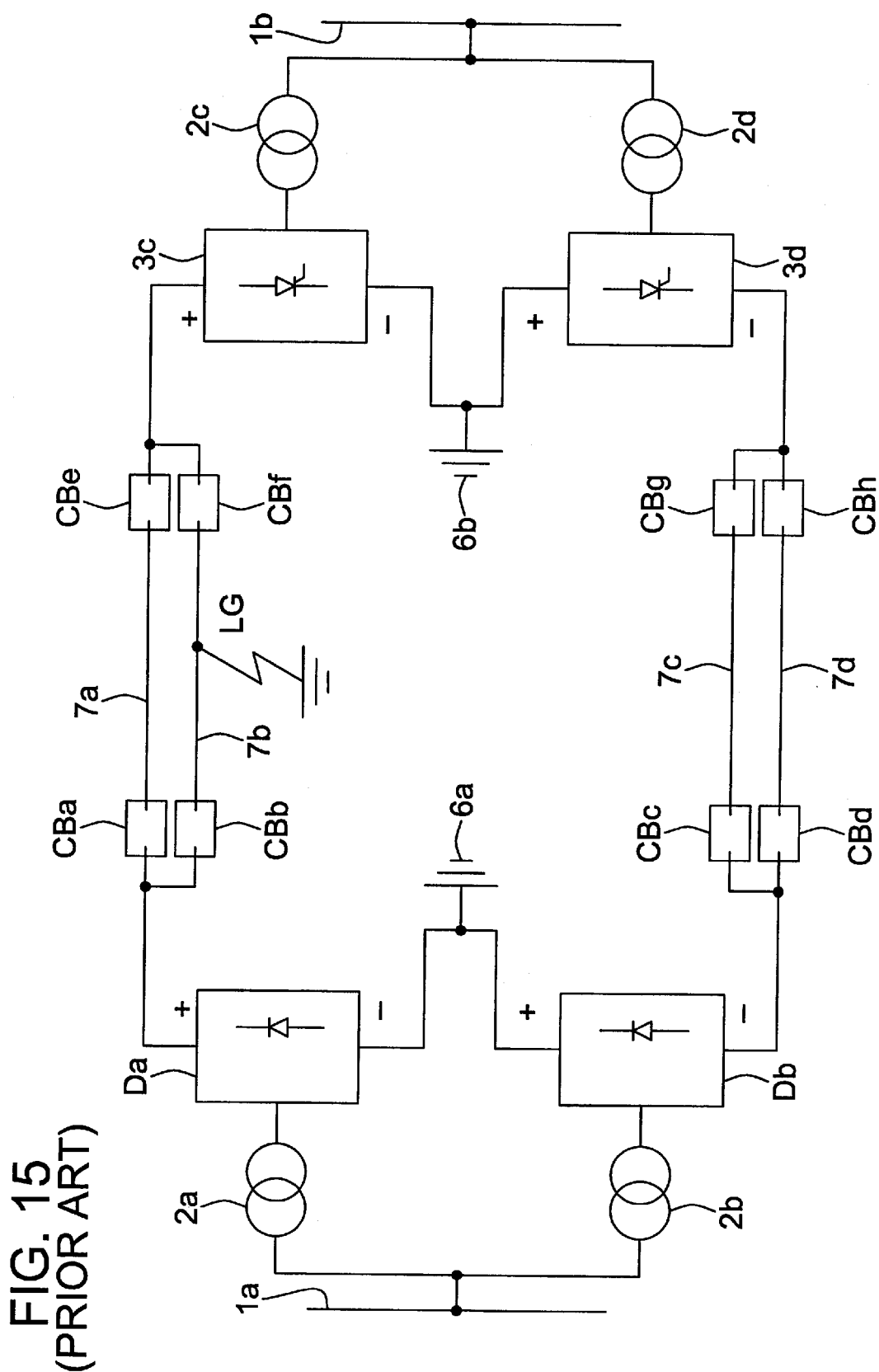
FIG. 15 is a view showing a conventional DC power transmission system.

In order to secure a quantity of power transmitted at the time of a ground fault in a prior art DC power transmission system shown in FIG. 15, a power transmission line of the ground fault is required to be disconnected by a DC circuit breaker. However, at the time of a ground fault in FIGS. 10 and 11, since transmission power and current can be shouldered by the normal converters by intensifying cooling, operation of the power converters connected to a power transmission line of the ground fault may be stopped and a circuit breaker at an AC side may be disconnected. Therefore, the expensive DC circuit breaker and spare power transmission lines become unnecessary.

In the foregoing description, the fault of the power system, which is directly associated with the converters 3, has been described. In this emergent state, such a case may happen that overload operation should be performed by other requirements or requirements of other converters. In this case, the emergency command X is issued not upon detection of overcurrent but as increase of an overload operation command or a command on output of the converters. Therefore, it is also possible to employ an arrangement in which in response to the command X from another converter (not shown), cooling capability of still another converter is controlled.

Meanwhile, in all the above embodiments and examples, the refrigerant has been described as liquid. In the case of liquid cooling, since its thermal capacity is larger than that of air, the effects of the present invention become more conspicuous than air. However, the present invention may also be applicable to air.

In the case of air cooling, only if a measure for reducing heat transfer resistance is taken, for example, the number of heat dissipation fins of the semiconductor stack is increased or maximum wind velocity is raised, the effects of the present invention can be gained in the same manner as liquid cooling.

In the semiconductor power converter of the present invention, since control is performed such that temperature of the refrigerant after cooling of the device is kept constant or difference between temperature of the refrigerant prior to cooling of the device and that after cooling of the device is kept constant as described above, the heat cycle to which the device is subjected is lessened, so that such effects are achieved that service life and reliability of the device can be upgraded.

Meanwhile, since the refrigerant kept at especially low temperature is intensely fed when overcurrent flows through the device or overload operation is performed, the effect that the short-time overcurrent capability (short-time burden) can be raised is obtained.

In the case of the power converter for DC power transmission, since the normal converters may be burdened with current at the time of the ground fault by intensifying cooling, operation of the power converters connected to the power transmission line of the ground fault may be stopped by disconnecting the circuit breaker at the AC side, so that such effects are achieved that the expensive DC circuit breaker and spare power transmission lines become unnecessary. Meanwhile, when there is a need to perform overload power transmission by another external overload, the effect is obtained that this rapid power transmission capability is upgraded.

Industrial Applicability

The semiconductor power converter of the present invention can be used not only as a converter of a power system such as a frequency converter and an inverter for solar thermal power generation and windmill power generation but as semiconductor power converters of all applications such as railroad, general industry and watercraft.

What is claimed is:

1. A semiconductor power converter for power conversion between an input power system and an output power system by controlling current with a power semiconductor device, comprising:
   a cooling liquid path for flow of a cooling liquid to cool a power semiconductor device which generates heat;
   liquid delivery means for delivering the cooling liquid through the cooling liquid path;
   electricity detecting means for detecting operating voltage and operating current of the semiconductor power converter to determine heat loss of the semiconductor power converter; and flow control means for controlling flow rate of the cooling liquid via the liquid delivery means and providing continuous and variable control of the flow rate of the cooling liquid in response to the heat loss determined by the electricity detecting means.

2. The semiconductor power converter according to claim 1, further comprising temperature difference detecting means for detecting a difference between temperature of the cooling liquid prior to cooling of the power semiconductor device and after cooling of the power semiconductor device wherein the flow control means controls the flow rate of the cooling liquid in response to the temperature difference detected by the temperature difference detecting means.

3. The semiconductor power converter according to claim 1, wherein the electricity detecting means issues a command based on the heat loss of the semiconductor power converter.

4. The semiconductor power converter according to claim 1, wherein the output power system is an AC motor and the operating voltage and operating current are associated with torque of the AC motor.

5. The semiconductor power converter according to claim 1, wherein the flow control means includes storage means for storing emergency cooling liquid, valve means for delivering to the cooling liquid path the emergency cooling liquid stored in the storage means, signal generating means for generating a signal when the operating current flowing through the power semiconductor device exceeds a threshold level, and an emergency cooling command circuit for opening the valve means in response to the signal generated by the signal generating means.

6. The semiconductor power converter according to claim 5, further comprising:
a cooling apparatus for cooling the emergency cooling liquid to a temperature lower than a temperature of the cooling liquid prior to cooling of the power semiconductor device.

7. The semiconductor power converter according to claim 5, wherein the flow rate of the cooling liquid is increased by the flow control means in response to the signal of the signal generating means.

8. An apparatus including the power semiconductor converter of claim 5, and including a DC power transmission system for connecting a plurality of AC power systems by DC lines, wherein, upon detection of a ground fault on one of the DC lines, conversion of the semiconductor power converter at a first pole side close to the ground fault is stopped and an output of the semiconductor power converter at a second pole side is increased and the emergency cooling liquid is delivered by controlling the valve means of the semiconductor power converter at the second pole side.

* * * * *